(12) United States Patent
Honda

(10) Patent No.: US 9,053,402 B2
(45) Date of Patent: Jun. 9, 2015

(54) WIRELESS IC TAG AND METHOD FOR MANUFACTURING WIRELESS IC TAG

(75) Inventor: Kenichi Honda, Toyama (JP)

(73) Assignee: TATEYAMA KAGAKU INDUSTRY CO., LTD., Toyama (JP)

( * ) Notice: Subject to any disclaimer, the term of this patent is extended or adjusted under 35 U.S.C. 154(b) by 1240 days.

(21) Appl. No.: 12/525,042

(22) PCT Filed: May 12, 2008

(86) PCT No.: PCT/JP2008/058697
§ 371 (c)(1),
(2), (4) Date: Mar. 8, 2010

(87) PCT Pub. No.: WO2008/143043
PCT Pub. Date: Nov. 27, 2008

(65) Prior Publication Data
US 2011/0006119 A1    Jan. 13, 2011

(30) Foreign Application Priority Data

May 14, 2007   (JP) .................................. 2007-127986
Jun. 7, 2007   (JP) .................................. 2007-151880

(51) Int. Cl.
*G06K 19/06*   (2006.01)
*G06K 19/077*  (2006.01)
*H01Q 1/22*    (2006.01)
(Continued)

(52) U.S. Cl.
CPC ..... *G06K 19/07749* (2013.01); *Y10T 29/49018* (2015.01); *G06K 19/0775* (2013.01); *H01Q 1/2225* (2013.01); *H01Q 7/00* (2013.01); *H05K 1/165* (2013.01); *H05K 3/222* (2013.01); *H05K 3/3421* (2013.01); *H05K 3/3484* (2013.01); *H05K 2201/10287* (2013.01); *H05K 2201/10674* (2013.01); *H01L 2224/16225* (2013.01);
(Continued)

(58) Field of Classification Search
USPC ......................................................... 235/492
See application file for complete search history.

(56) References Cited

U.S. PATENT DOCUMENTS 5,566,441 A    10/1996  Marsh et al.
6,100,804 A *   8/2000  Brady et al. ............... 340/572.7
(Continued)

FOREIGN PATENT DOCUMENTS

JP    59-85394 A    5/1984
JP    64-56595 A    3/1989
(Continued)

*Primary Examiner* — Michael G Lee
*Assistant Examiner* — David Tardif
(74) *Attorney, Agent, or Firm* — Birch, Stewart, Kolasch & Birch, LLP

(57) ABSTRACT

A wireless IC tag which has an electrically insulative substrate, an antenna circuit provided on the surface of the substrate and an IC chip connected to the antenna circuit, wherein the antenna circuit is formed of solder and the IC chip is connected to the antenna circuit via the solder, and
A wireless IC tag comprising an electrically insulative substrate, an antenna circuit provided on the surface of the substrate, an IC chip connected to the antenna circuit, and a jumper wire connected to the antenna circuit,
wherein the antenna circuit is formed of a solder,
the jumper wire is insulatively coated with a resin composition that evaporates, decomposes, or melts at a temperature not higher than a soldering temperature, and
the jumper wire is located on the same side of the substrate where the antenna circuit is provided.

19 Claims, 6 Drawing Sheets

(51) Int. Cl.
*H01Q 7/00* (2006.01)
*H05K 3/22* (2006.01)
*H05K 1/16* (2006.01)
*H05K 3/34* (2006.01)

(52) U.S. Cl.
CPC .............. *H01L2224/32225* (2013.01); *H01L 2224/73204* (2013.01); *H01L 2224/83192* (2013.01)

(56) References Cited

U.S. PATENT DOCUMENTS

| | | | |
|---|---|---|---|
| 2006/0009251 A1* | 1/2006 | Noda et al. | 455/550.1 |
| 2006/0131426 A1* | 6/2006 | Ishikawa et al. | 235/492 |
| 2006/0181478 A1* | 8/2006 | Benato | 343/895 |
| 2007/0122960 A1* | 5/2007 | Aoki | 438/197 |
| 2007/0138303 A1* | 6/2007 | Asakura et al. | 235/492 |

FOREIGN PATENT DOCUMENTS

| | | | |
|---|---|---|---|
| JP | 6-45743 A | 2/1994 |
| JP | 6-282699 A | 10/1994 |
| JP | 6-32887 A | 11/1994 |
| JP | 7-22831 A | 1/1995 |
| JP | 11-175683 A | 7/1999 |
| JP | 11-291684 A | 10/1999 |
| JP | 2000-113142 A | 4/2000 |
| JP | 2000-182017 A | 6/2000 |
| JP | 2001-126044 A | 5/2001 |
| JP | 2001-211019 A | 8/2001 |
| JP | 2002-35849 A | 2/2002 |
| JP | 2002-298109 A | 10/2002 |
| JP | 2003-44807 A | 2/2003 |
| JP | 2003-133053 A | 5/2003 |
| JP | 2003-178629 A | 6/2003 |
| JP | 2003-196634 A | 7/2003 |
| JP | 2005-108259 A | 4/2005 |
| JP | 2005-167813 A | 6/2005 |
| JP | 2006-24087 A | 1/2006 |
| JP | 2006-122913 A | 5/2006 |
| JP | 2006-127424 A | 5/2006 |
| JP | 2006-185428 A | 7/2006 |
| JP | 2006-344871 A | 12/2006 |
| JP | 2008-282320 A | 11/2008 |

* cited by examiner (a)

(b)

(c)

US 9,053,402 B2

WIRELESS IC TAG AND METHOD FOR MANUFACTURING WIRELESS IC TAG

TECHNICAL FIELD

The present invention relates to a wireless IC tag. More particularly, the present invention relates to a low-cost and thin wireless IC tag having an antenna circuit that offers excellent communication characteristics. The present invention also relates to an inexpensive wireless IC tag of a simple structure and modulated to a desired resonant frequency. Further, the present invention relates to a method for manufacturing the above-mentioned wireless IC tag.

BACKGROUND ART

The wireless IC tag (including a wireless IC card, and hereinafter generally referred to as "IC tag") generally has an antenna circuit formed on a surface of an insulative substrate such as a resin film. An IC chip is mounted on the substrate carrying the antenna circuit, and connected to the antenna circuit.

Because of carrying the IC chip, the storage capacity of the IC tag is far beyond that of a barcode or an ID tag, and also accepts free writing of additional information. In particular, a flat type IC tag is widely utilized because of ease in transportation and attachment to other devices.

Now, a less expensive IC tag, which yet offers the excellent communication characteristics, is being eagerly desired, for further expanding the utilization of the IC tag.

Regarding such IC tag, for example, a patented document 1 discloses an IC tag that has a circuit pattern formed of a metal such as copper or silver, or a conductive paste.

This document also discloses methods of forming the circuit pattern, including winding a coated wire in a coil shape, and forming a coil pattern by an etching process over a conductive metal such as copper laminated on the substrate.

Regarding the description in the patented document 1, however, the metal such as copper or silver is expensive, which impedes reducing the material cost. Besides, the circuit pattern formed of the conductive paste is inferior in conductivity to a coil pattern formed of a metal thin film made by vapor deposition or plating, and hence consumes larger power but offers a shorter communication range, in other words the communication characteristic is degraded. To overcome such drawback it is necessary to increase the line width of the coil pattern, which incurs not only an increase in material cost due to the expansion of the line width, but also an additional disadvantage that a floating capacitance emerges.

Also, winding the coated wire in a coil shape requires a troublesome work, which impedes reducing the manufacturing cost.

Further, forming a copper thin layer all over the surface of the insulative resin and performing the etching process to thereby form the coil pattern constitutes factors that inhibit the cost reduction, because such method requires complicated works not only for the formation process but also for the incidental works such as a preliminary process and disposal of wastes, the manufacturing equipment has to be complicated and large-scaled and the applicable substrates are limited.

It might be an option to employ aluminum or silver instead of copper, however those metals, including copper, all have a high melting point, which makes those metals difficult to be processed.

In addition, those metals each have particular drawbacks, such that copper is susceptible to oxidation and hence unsuitable for a heat treatment; aluminum has low conductivity; and silver has poor spreadability and is hence difficult to be formed into a foil.

Referring now to FIG. 8, a conventional IC tag will be described. FIG. 8 schematically depict a structure of the conventional IC tag, in which FIG. 8(a) is a plane view thereof, and 8(b) a fragmentary cross-sectional view taken along a line A-A' of FIG. 8(a).

In FIG. 8, the reference numeral 301 designates the IC tag, and 302 designates an electrically insulative substrate. 303 to 306 designate those composing antenna circuits, among which 304 and 306 designate the respective end portions of the antenna circuits. 307 designates an IC chip, and two electrodes of the IC chip 307 (not shown) are each connected via the antenna circuits 303 and 305 respectively. From the two end portions 304 and 306 of the antenna circuit formed on one surface of the substrate 302, through holes 311, 312 are respectively provided so as to penetrate to the other surface of the substrate, and the through holes 311, 312 are, for example, filled with solder, after which a jumper wire 310 made of a conductive wire is fixed and connected to the through holes, on the other surface of the substrate 302. The solder may be substituted with a conductor having a fastening function such as an eyelet, for fixing and connecting the jumper wire.

Meanwhile, the resonant frequency of the foregoing IC tag is determined from the static capacitance specific to the IC chip 307, and the inductance obtained from the length of the antenna circuits 303 to 306 connecting the through holes 311, 312. Accordingly, methods for adjusting the resonant frequency of the IC tag so far proposed include providing a capacitor and a resistor in the antenna circuit, to thereby add the static capacitance (patented document 2), and occasionally connecting and disconnecting a plurality of antenna circuits so as to change the length of the antenna circuit (patented document 3).

The proposal according to the patented document 2, however, incurs an increase in number of parts and hence in manufacturing cost, since the capacitor for adjustment and the resistor for adjustment are provided in the antenna circuit. Besides, the IC tag thus configured may shorten the communication range.

Regarding the patented document 3, the length of the antenna circuit is adjusted through forming a plurality of electrically connected antenna coils on the surface of the insulative substrate and cutting off the connection of an unnecessary antenna circuit if needed, and therefore the structure of the antenna circuit becomes very complicated and the manufacturing cost is increased. Also, the IC tag thus configured may be larger in size.

Thus, the conventional IC tag cannot be evaluated as sufficiently inexpensive yet having excellent communication characteristics, and it is impossible to easily and inexpensively adjust the resonant frequency.

Patented document 1: JP-A No. 2006-304184
Patented document 2: JP-A No. 2001-010264
Patented document 3: JP-A No. 2001-251115

DISCLOSURE OF THE INVENTION

Problem to be Solved by the Invention

An object of the present invention is to solve the foregoing problems incidental to the conventional IC tag. In other words, the first object of the present invention is to provide a method for manufacturing an IC tag which is less expensive yet excellent in communication characteristics.

A second object of the present invention is to provide an inexpensive IC tag having a simple structure that eliminates the need to add a capacitor and the like, and which allows easily adjusting a length of an antenna circuit as desired, to thereby attain a desired resonant frequency, and a method for manufacturing such IC tag.

Means for Solving the Problem

The present invention has been accomplished for achieving the foregoing objects. Hereunder, each claim of the present invention will be described.

The invention according to Claim 1 is:

a wireless IC tag which has an electrically insulative substrate, an antenna circuit provided on the surface of the substrate and an IC chip connected to the antenna circuit, wherein the antenna circuit is formed of solder and the IC chip is connected to the antenna circuit via the solder.

The wireless IC tag according to Claim 1 allows achieving the foregoing first object. To be more detailed, since the wireless IC tag of Claim 1 employs the solder, which is less expensive than silver, to form the antenna circuit of the IC tag, the IC tag can be obtained at a lower cost.

Also, since the solder is more conductive than the conventional conductive paste, the IC tag can offer excellent communication characteristics without extremely expanding the line width of the antenna circuit.

Further, because of the low melting point and excellent processability of the solder, the manufacturing process can be executed under higher degree of freedom, without employing complicated or large-scaled manufacturing equipments, and a wider selection range of the substrate can be secured, and thus the IC tag can be easily obtained without incurring an increase in manufacturing cost.

The solder employed for forming the antenna circuit is not specifically limited, but a Sn—Ag—Cu lead-free solder or a silver solder may be employed, other than an ordinary Sn—Pb alloy solder (melting point approx. 183° C.).

Also, since in the wireless IC tag of Claim 1, the IC chip and the antenna circuit are connected via the solder, it is not necessary to employ a conventional method that utilizes an anisotropic conductive paste (ACP) which is quite expensive (JP-A No. 2006-304184), or the ultrasonic welding, to connect the IC chip and the antenna circuit. Therefore, the IC tag can be obtained at a lower cost.

The connection of the antenna circuit and (an electrode of) the IC chip may be directly achieved by melting the solder constituting the antenna circuit, or through locating a bonding solder on a position where the electrode is to be connected and hot-melting the solder with the electrode disposed in contact therewith, which is also an easy process.

The type of the bonding solder is not specifically limited, but it is preferable to employ the solder having a melting point not exceeding that of the solder used for forming the antenna circuit, for example, a Bi—Sn solder having a prominently low melting point among various solders, in order to prevent the antenna circuit from being damaged.

In the wireless IC tag according to Claim 1, the material of the substrate is not limited as long as that material permits forming the antenna circuit thereon and executing the process for electrical connection of the antenna circuit. Since the antenna circuit is formed of the solder having a low melting point, a paper, a synthetic resin or glass, which are not necessarily sufficiently heat-resistant, may be employed as the substrate. In the case of employing glass as the substrate, the antenna circuit may be formed directly on the surface of the substrate, utilizing a special flux or by ultrasonic soldering.

Also, in the wireless IC tag according to Claim 1, the antenna circuit may be formed on a different ground material and then transferred to the substrate, instead of directly forming the antenna circuit on the substrate.

The invention according to Claim 2 is a wireless IC tag according to Claim 1 in which the substrate is made of a paper.

In the wireless IC tag of Claim 2, the substrate is made of a paper which is inexpensive, and hence the material cost can be further reduced.

Also, the paper is easily obtainable in a minimal thickness, and therefore the IC tag can be easily made thin.

The substrate made of a paper can also keep, unlike the substrate made of a synthetic resin, the circuit pattern material from flowing out to a peripheral region even though the substrate is not subjected to a particular surface roughening treatment in the printing process of the paste-type material for forming the circuit pattern, thereby allowing easy and accurate formation of the pattern with excellent processability. Also, the applied paste-type pattern material infiltrates into the paper, thereby enhancing the adhesion.

Further, the paper is generally superior in heat resistance to the resin. Accordingly, employing the paper as the substrate further facilitates the process of forming the antenna circuit with the molten solder.

The term "paper" herein referred to may include, without specific limitation, not only a pure paper (cellulose, resin pulp), but also a paper impregnated with a resin or subjected to a certain surface treatment.

It is preferable to employ a glassine paper (paraffin paper) among the paper materials to form the substrate, because it allows easily and accurately forming the antenna circuits. It is to be noted that the glassine paper herein referred to also includes a smooth heat-resistant paper formed by applying a silicone treatment to the glassine paper surface.

The invention according to Claim 3 is a wireless IC tag according to Claim 1 or Claim 2, in which the IC chip is located on the side of the substrate where the antenna circuit is provided.

The wireless IC tag according to Claim 3 can be made still thinner, because the IC chip is located on the side of the substrate where the antenna circuit is provided.

The invention according to Claim 4 is a wireless IC tag according to any one of Claims 1 to 3, which further comprises attaching a sheet made of a material having a high dielectric constant to the substrate.

The wireless IC tag according to Claim 4 can maintain the thin configuration merely with attaching the sheet made of the material having a high dielectric constant, and yet secure the excellent communication characteristics even when attached to a metal body.

The invention according to Claim 5 is a wireless IC tag according to any one of Claims 1 to 3, in which the substrate is made of a material having a high dielectric constant.

The wireless IC tag according to Claim 5 can be made thinner and yet exhibit the excellent communication characteristics, because the substrate itself is made of the material having a high dielectric constant, instead of attaching the sheet made of the material having a high dielectric constant to the substrate.

The invention according to Claim 6 is:

a method for manufacturing a wireless IC tag, comprising forming the same pattern as that of an antenna circuit with a material having wettability with molten solder, on a surface of an electrically insulative substrate, and then forming the antenna circuit on the pattern with the molten solder.

In the invention of Claim 6, since the same pattern as the antenna circuit is formed in advance with the material having wettability with the molten solder on the surface of the substrate, it is able to stick the solder on the surface of the substrate according to the pattern, and thereby easily forming the antenna circuit.

Examples of the material having wettability with the molten solder include various metal particles, though not specifically limited. Among those, it is preferable to employ nickel particles or copper particles with the surface coated with silver, because of excellent wettability with the molten solder.

In the case of employing such metal particles, the method of forming the same pattern as the antenna circuit with the metal particles is not specifically limited. For example, a vapor deposition process may be applied, however it is preferable to form a coated layer of an adhesive resin by screen printing, sprinkle the metal particles over the adhesive resin, and then sweep off the metal particles not adhered to the adhesive resin so as to remove the surplus metal particles. The latter method allows minimizing the consumption of the metal particles, and easily forming a thin pattern.

To form the antenna circuit with solder on the pattern made of the metal particles, it is preferable, in the case of using a substrate made of an ordinary paper which is not water-resistant, to employ a cream solder reflow process including applying the cream-type solder all over the substrate by a printing process, hot-melting the solder to thereby spread over the surface of the conductive ground material, and then blowing off with nitrogen the molten solder assuming a ball shape in the remaining region. A flow dip process may be adopted, in which the substrate is soaked in a molten solder bath.

The invention according to Claim 7 is:

the method for manufacturing a wireless IC tag according to claim 6, wherein the material having wettability with the molten solder is a solderable resin.

The solderable resin can easily form the pattern on the substrate by a printing process such as screen printing. Accordingly, the invention of claim 7 allows easily forming the antenna circuit with solder, in a predetermined pattern.

Also, the solderable resin exhibits excellent adhesion with the substrate, and hence fixes the antenna circuit more firmly to the substrate.

The solderable resin applicable to the present invention is not specifically limited, however a mixture of a metal powder, a resin binder and an unsaturated fatty acid, dissolved in an organic solvent, may be employed. Examples of the metal powder include silver powder, copper powder, nickel powder, aluminum powder, silver-coated copper powder, silver-coated nickel powder, silver-copper alloy powder, among which it is preferable to employ, from the viewpoint of solderability, the silver-coated nickel powder, the silver-coated copper powder, or a powder mixture containing these powders and the silver powder.

Examples of the resin binder include thermosetting resins such as an epoxy resin, a melamine resin, a phenol resin, a polyimide resin, among which the epoxy resin and the phenol resin are preferable, from the viewpoint of film characteristics. Regarding the thermosetting resins, it is preferable to employ a low-temperature (200° C. or lower) setting resin, because the affect of heating to the substrate can be suppressed as much as possible.

Further, an unsaturated fatty acid such as oleic acid, linoleic acid, or linolenic acid may be dissolved in the solderable resin. Among those, it is preferable to employ the oleic acid because of the capability of preventing the oxidation of the metal powder surface, and promoting the destruction of the oxide layer that may have been formed.

Examples of the organic solvent for turning the solderable resin into a paste form appropriate for printing include, though not specifically limited as long as the thermosetting resin can be uniformly dispersed in the paste, butyl carbitol, methyl carbitol, and Solvesso 150.

Here, the mixing ratio of the metal powder and the resin in the solderable resin is not specifically limited, but may be suitably determined so as to enable the adhesion with the solder. Also, a commercially available product may be employed as the solderable conductive resin containing the metal powder.

The invention according to Claim 8 is:

a method for manufacturing a wireless IC tag, comprising:

forming an antenna circuit made of a material having wettability with molten solder, on an electrically insulative substrate, placing an IC chip on the antenna circuit, via solder paste containing solder and an adhesive thermosetting resin, hot-melting the solder paste at a temperature not lower than the melting point of the solder component, and heat-curing the adhesive thermosetting resin in the solder paste at a temperature not higher than the melting point of the solder component, thereby connecting the IC chip to the antenna circuit.

According to the method of Claim 8, for providing the IC chip on the antenna circuit formed with the material having wettability with molten solder, such an extremely simple process of applying the solder paste containing the solder and the adhesive thermosetting resin, hot-melting the solder paste at a temperature not lower than the melting point of the solder component, and heat-curing the adhesive thermosetting resin in the solder paste at a temperature not higher than the melting point of the solder component, enables firmly bonding the IC chip to the antenna circuit and the substrate.

The present inventor has discovered that, in the solder paste hot-melted at a temperature not lower than the melting point of the solder component, the molten solder component concentrates around the electrode of the IC chip while the adhesive thermosetting resin component contained in the solder paste is not yet cured, so that a region predominantly containing the solder component and a region predominantly containing the adhesive thermosetting resin are created, and that at this stage the IC chip is caused by such phenomenon to spontaneously migrate to an appropriate position, though initially the IC chip was not accurately positioned at the junction point of the antenna circuit. Based on this discovery, the present inventor has completed the invention of Claim 8. In other words, the region predominantly containing the solder component encourages the IC chip to be connected to the antenna circuit, while the region predominantly containing the adhesive thermosetting resin firmly fixes the IC chip to the substrate, at which moment the IC chip is made to spontaneously migrate to the appropriate position.

In the method according to Claim 8, examples of the applicable adhesive thermosetting resin include, without specific limitation, the thermosetting resins such as the epoxy resin, melamine resin, phenol resin, and polyimide resin. Here, it is preferable to employ a low-temperature setting resin, because such resin can be easily cured without damaging the antenna circuit and the substrate.

Although the type of the solder constituting the solder component is not specifically limited, it is preferable to employ a low-melting point solder such as an In—Sn solder (melting point 118° C.) or a Bi—Sn solder (melting point 132° C.) in order not to damage the antenna circuit, out of which the Bi—Sn solder is particularly preferable because of being inexpensive.

As stated earlier, conventionally the method that utilizes the anisotropic conductive paste (ACP) which is quite expensive, or the ultrasonic welding process has been employed for fixing the IC chip on the antenna circuit. Besides, the IC chip has to be positioned with extremely high accuracy because the electrodes, as well as the spacing between the electrodes are quite fine. In contrast, the method according to Claim 8 employs the inexpensive materials and process to fix the IC chip, thereby enabling obtaining the IC tag at a lower cost.

The invention according to claim 9 is:

a wireless IC tag comprising an electrically insulative substrate, an antenna circuit provided on the surface of the substrate, an IC chip connected to the antenna circuit, and a jumper wire connected to the antenna circuit, wherein the antenna circuit is formed of a solder, the jumper wire is insulatively coated with a resin composition that evaporates, decomposes, or melts at a temperature not higher than a soldering temperature, and the jumper wire is located on the same side of the substrate where the antenna circuit is provided.

The invention according to claim 9 achieves the foregoing second object. More specifically, according to the invention of claim 9, the jumper wire is located on the same side of the substrate where the antenna circuit is provided, which allows easily connecting the jumper wire at a desired position on the antenna circuit. Besides, since the jumper wire is insulatively coated with the resin composition, there is no likelihood that a short circuit is incurred with the antenna circuit halfway of the jumper wire. Consequently, the IC tag having a simple structure, which yet allows freely adjusting the length of the antenna circuit and thereby obtaining a predetermined resonant frequency, can be easily obtained at a low cost.

According to the invention of claim 9, since the antenna circuit is formed of the solder, and hence the connection with the conductor of the jumper wire can be easily achieved.

Also, since the solder is less expensive than aluminum, copper and silver, the IC tag can be obtained at a low cost. Further, because of the low melting point and excellent processability of the solder, the manufacturing process can be executed under higher degree of freedom, without employing complicated or large-scaled manufacturing equipments, and a wider selection range of the substrate can be secured, and thus the IC tag can be easily obtained at a low cost without incurring an increase in manufacturing cost.

Further, according to the invention according to claim 9, in the case of employing the resin composition that evaporates or decomposes at a temperature not higher than the soldering temperature, i.e. the temperature set for executing the soldering, simply heating the position where the jumper wire and the antenna circuit are to be connected to the soldering temperature allows eliminating the insulative coating on the jumper wire to thereby expose the unoxidized conductor metal, and melting the solder constituting the antenna circuit to thereby directly connect the exposed conductor and the solder.

Also, in the case of employing the resin composition that melts at a temperature not higher than the soldering temperature, simply heating the position where the jumper wire and the antenna circuit are to be connected to the soldering temperature allows removing the insulative coating of the jumper wire to thereby expose the unoxidized conductor metal, and melting the solder constituting the antenna circuit to thereby directly connect the exposed conductor and the solder. Here, the molten resin composition is prone to remain stuck to the conductor metal, however applying an ultrasonic wave at the same time as the heating enables more smoothly removing the insulative coating on the jumper wire.

The foregoing method thus allows directly connecting the jumper wire and the antenna circuit without exposing the conductor of the jumper wire in advance, and thereby enables more efficiently executing the process and providing the IC tag at a lower cost.

Thus, according to the invention of claim 9, in which the antenna circuit formed of the solder and the jumper wire, insulatively coated with the resin composition that evaporates, decomposes, or melts at a temperature not higher than a soldering temperature, are located on the same side of the substrate, provides an inexpensive IC tag that allows easily adjusting the length of the antenna circuit as desired to thereby obtain a predetermined resonant frequency.

In the invention according to claim 9, the material of the electrically insulative substrate is not limited as long as that material permits forming the antenna circuit thereon and executing the process for electrical connection of the antenna circuit. Since the antenna circuit of the first type of wireless IC tag is formed of the solder having a very low melting point compared with aluminum, copper or silver, a paper, a synthetic resin or glass, which are not necessarily sufficiently heat-resistant, may be employed as the substrate. In the case of employing glass as the substrate, the antenna circuit may be formed directly on the surface of the substrate, utilizing a special flux or by ultrasonic soldering.

The solder employed for forming the antenna circuit is not specifically limited, but a Sn—Ag—Cu lead-free solder or a silver solder may be employed, other than the ordinary Sn—Pb alloy solder (melting point approx. 183° C.).

The formation method of the antenna circuit from the solder is not specifically limited, but, for example, a method wherein the same pattern as the antenna circuit is formed with the material having wettability with the molten solder on the substrate surface and then the surface is coated with the molten solder, other than directly forming the antenna circuit with the molten solder on the substrate.

Also, the antenna circuit may be formed on a different ground material and then transferred to the substrate, instead of directly forming the antenna circuit on the substrate.

The conductor of the jumper wire may be constituted, without specific limitation, of various metals popularly used for insulated wires. Copper is preferable because of its excellent flexibility and conductivity, and compatibility with the soldering process.

It is preferable to employ, as the resin composition to coat the conductor with, a resin composition that evaporates, decomposes or melts at a temperature not higher than the soldering temperature for forming the antenna circuit. Specific examples of such resin component include thermoplastic resins such as a polyolefin resin including polyethylene and a polyurethane resin.

Although the thickness of the insulative coating is not specifically limited, it is preferable to make it as thin as possible, from the viewpoint of reducing the thickness of the IC tag and securing the flexibility of the coated wire.

The invention according to claim 10 is:

the wireless IC tag according to claim 9, wherein the substrate is made of a paper.

In the invention according to claim 10, the substrate is made of a paper which is inexpensive, and hence the material cost can be further reduced. Also, the paper is easily obtainable in a minimal thickness, and therefore the IC tag can be easily made thin.

The substrate made of a paper can also keep, unlike the substrate made of a synthetic resin, the circuit pattern material from flowing out to a peripheral region even though the substrate is not subjected to a particular surface roughening treatment, in the printing process of the paste-type material for forming the circuit pattern, thereby allowing easy and accurate formation of the pattern with excellent processability. Also, the applied paste-type pattern material infiltrates into the paper, thereby enhancing the adhesion.

Further, the paper is generally superior in heat resistance to the resin. Accordingly, employing the paper as the substrate further facilitates the process of forming the antenna circuit with the molten solder.

The paper herein referred to may include, without specific limitation, not only a pure paper (cellulose, resin pulp), but also a paper impregnated with a resin or subjected to a certain surface treatment.

It is preferable to employ a glassine paper (paraffin paper) among the paper materials to form the substrate, because from the viewpoint of heat resistance and smoothness it allows easily and accurately forming the antenna circuit of the solder.

It is to be noted that the glassine paper herein referred to also includes a smooth heat-resistant paper formed by applying a silicone treatment to the glassine paper surface.

The invention according to claim 11 is:
the wireless IC tag according to claim 9 or claim 10, wherein an end portion of the jumper wire is connected to an end portion of the antenna circuit, and the other end portion is connected to a position where a predetermined resonant frequency of the antenna circuit can be attained.

In the invention according to claim 11, such a simple configuration that an end portion of the jumper wire is connected to an end portion of the antenna circuit, and the other end portion is connected to a position where a predetermined resonant frequency of the antenna circuit can be attained, allows attaining a desired resonant frequency over an extensive resonant frequency range, and easily providing the IC tag at a low cost.

The invention according to claim 12 is:
the wireless IC tag according to any one of claims 9 to 11, wherein the insulative coating on the jumper wire is formed by baking an insulating varnish mainly containing a polyurethane resin, over the conductor.

The invention according to claim 12 specifies the jumper wire constituted of the conductor coated with the insulating varnish predominantly containing a polyurethane resin, baked over the conductor. This is because the jumper wire with the insulating varnish predominantly containing a polyurethane resin baked thereon has been traditionally used popularly with proven reliability as a magnet wire or an UEW, and is also easily obtainable.

The invention according to claim 13 is:
the wireless IC tag according to any one of claims 9 to 12, wherein the substrate has a layer constituted of a highly permeable material.

According to the invention of claim 13, the simple structure that the substrate has the layer constituted of the highly permeable material allows securing the thin IC tag maintaining the excellent communication characteristics even when attached to a metal body.

Examples of the method for forming the layer of the highly permeable material include sticking a high permeability ferrite sheet to the substrate, printing a paste (ink) constituted of the highly permeable material, and coating by a plating process the highly permeable material.

In the case where the layer of the highly permeable material is provided on the side of the substrate opposite to where the antenna circuit is provided, the connection point of the jumper wire and the antenna circuit can still be modified if necessary even after forming the layer, so as to accurately set the resonant frequency at the desired value.

The invention according to claim 14 is:
the wireless IC tag according to any of claims 9 to 12, wherein the substrate is constituted of a highly permeable material.

According to the invention of claim 14, the substrate itself is constituted of the highly permeable material, instead of providing the layer constituted of the highly permeable material to the substrate, and therefore the IC tag can be made thinner, with the excellent communication characteristics.

The invention according to claim 15 is:
a method for manufacturing a wireless IC tag, comprising
forming an antenna circuit with solder on an electrically insulative substrate,
locating a jumper wire with an insulative coating of a resin composition that evaporates, decomposes or melts at a temperature not higher than a soldering temperature, provided around a conductor, on a side of the substrate where the antenna circuit is provided, and
heating the jumper wire to thereby connect the conductor to a predetermined position of the antenna circuit.

The invention according to claim 15 is an expression of the invention according to claim 9 in terms of the manufacturing method.

Effect of the Invention

The present invention provides a less expensive IC tag that exhibits excellent communication characteristics, and a method for manufacturing thereof.

The present invention also provides an inexpensive IC tag having a simple structure that requires no additional component such as a capacitor, which allows easily adjusting the length of the antenna circuit as desired to thereby attain a predetermined resonant frequency, and a method for manufacturing such IC tag.

Figure 1:
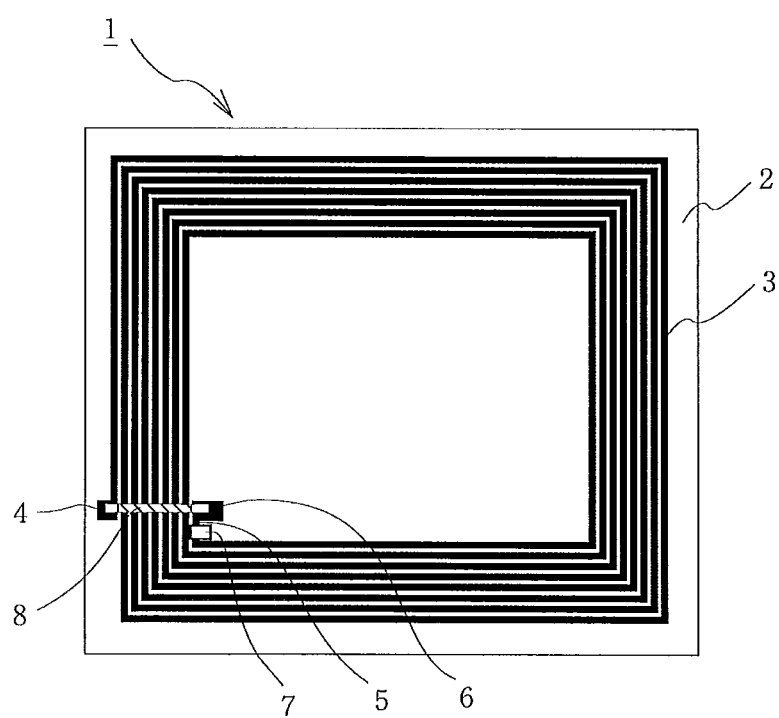
FIG. 1 is a schematic view showing an IC tag according to a first embodiment of the present invention.

REFERENCE NUMERALS 1, 301 IC tag
2, 302 substrate
3, 5, 303, 305 antenna circuit
4, 6, 304, 306 end portion of antenna circuit
7, 307 IC chip 8, 310 jumper wire
11 solder paste
12, 13 electrode
14 region predominantly containing solder
15 region predominantly containing adhesive thermosetting resin component
311, 312 through hole

BEST MODE FOR CARRYING OUT THE INVENTION

Hereunder, the present invention will now be described based on most preferred embodiments thereof. It is to be noted that the present invention is not limited to the following embodiments. The following embodiments can be subject to various modifications within the scope of the present invention and the equivalents thereof.

First Embodiment

Structure of IC Tag

This embodiment will be described hereunder, based on the drawings. FIG. 1 is a schematic view showing an IC tag according to this embodiment.

In FIG. 1, the reference numeral 1 designates an IC tag, and 2 a substrate (glassine paper manufactured by Lintec Corporation). Antenna circuits are denoted by 3 to 6, among which 4 and 6 designate the respective end portions of the antenna circuits. The numeral 7 designates an IC chip (I-CODE SLI manufactured by Philips Electronics N.V.), and two electrodes of the IC chip 7 (not shown) are each connected via the antenna circuit 3 and 5 respectively. The end portions 4 and 6 of the antenna circuit are connected via a jumper wire 8 (diameter 0.05 mm, coated with polyurethane in a thickness not less than 5 μm, manufactured by Riken Electric Wire Co., Ltd.).

The surface of the IC tag shown in FIG. 1 is finally laminated with a PET film (commercially available article, now shown) with a commercially available laminator (set at 110° C.), so that the IC tag is finished as a product.

Further details will be given hereunder, referring to FIGS. 2 and 3.

[Formation of Antenna Circuit]

Figure 2:
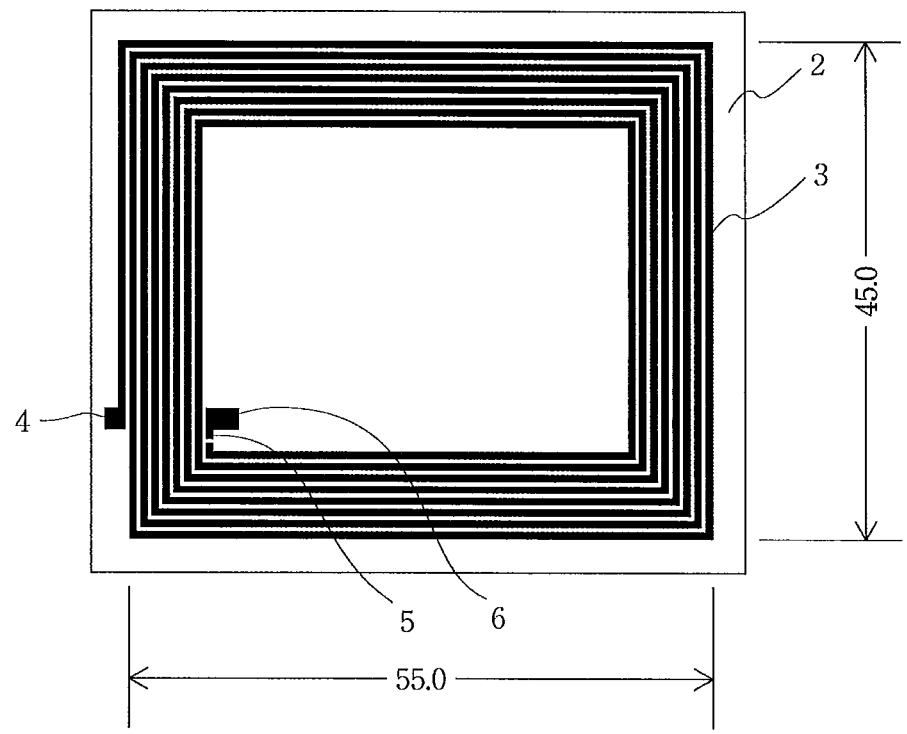
FIG. 2 is a view showing a pattern of an antenna circuit according to the first embodiment of the present invention.
Figure 3:
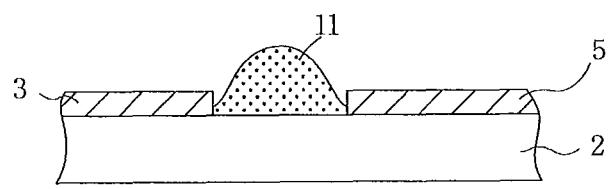
FIGS. 3(a) to 3(c) are views schematically showing a mounting process of an IC chip according to the present invention.
Figure 3:
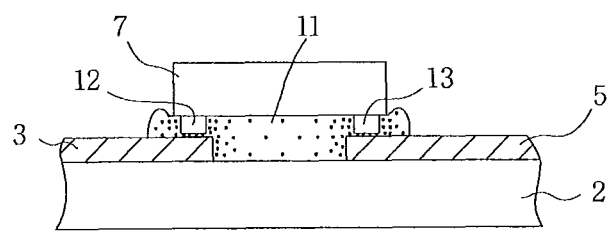
Figure 3:
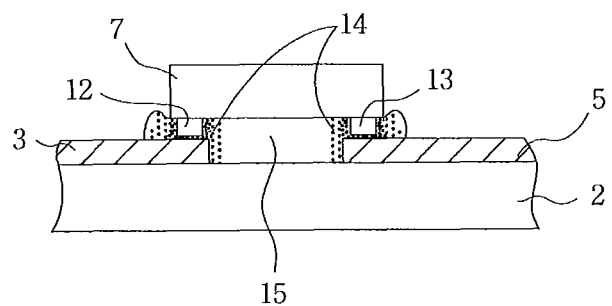

FIG. 2 depicts a pattern of the antenna circuit in the IC tag shown in FIG. 1.

The antenna circuits 3 and 5 are formed of a Sn—Ag—Cu solder (Sn-3.5Ag-0.5Cu). The antenna circuits 3 and 5 were formed through the following process.

The glassine paper (glassine F133 kg) was fixed by the effect of static electricity, to be utilized as the substrate. On such substrate, a pattern shown in FIG. 2 was screen-printed (printing condition: ST-325 mesh, emulsion thickness 10 μm) with a solderable resin (A-5050 manufactured by Nippon Paint Co., Ltd.), and the pattern was heated at 160° C. for 30 minutes, to thereby cure the resin. The pattern was adjusted so as to be formed in a line width of 0.75 mm and a line pitch of 0.25 mm.

The pattern thus formed was coated with a Sn—Ag—Cu wire solder containing flux of 0.6 mm in diameter, with a soldering iron (temperature setting: 325° C.). After removing the solder applied to a region other than the pattern, the end portions of the jumper wire were each soldered to the end portion 4 of the antenna circuit 3 and to the end portion 6 of the antenna circuit 5, respectively. Then the flux was cleaned and the substrate was dried, so that the antenna circuits 3 and 5 were obtained.

[Mounting IC Chip]

The IC chip 7 was then mounted. FIGS. 3(a) to 3(c) schematically illustrate the mounting process of the IC chip 7 on the substrate 2, which is proceeded from 3(a) to 3(c). As shown in FIG. 3(a), a predetermined amount of solder paste containing a solder and an adhesive thermosetting resin (Sn—Bi solder paste TYCAP-5401-11 manufactured by Tamura Kasei Co. Ltd.) 11 was applied with a dispenser, between the antenna circuits 3 and 5. Then as shown in FIG. 3(b), the IC chip 7 was tentatively placed on the substrate such that the two electrodes 12, 13 were each brought into contact with the antenna circuits 3 and 5 respectively.

Heat of 160° C. was applied for 10 seconds, to thereby melt the solder component contained in the solder paste. Then the temperature was lowered to 130° C. and maintained for 30 minutes, to thereby heat-cure the adhesive thermosetting resin.

During such process, the molten solder component concentrated around the electrodes 12, 13 having high wettability with the solder component and the vicinity of the surface of the antenna circuits 3, 5 formed of the solder layer, while the adhesive thermosetting resin component was not yet cured, so that a region predominantly containing the solder component 14 was created. Also, between the electrode 12 and the electrode 13, the region predominantly containing the adhesive thermosetting resin component 15 was created.

It was confirmed that, despite that the IC chip was not accurately positioned at the predetermined location because the IC chip was tentatively mounted manually, the balance of forces generated by the emergence of region predominantly containing the solder component 14 and the region predominantly containing the adhesive thermosetting resin component 15 caused the IC chip to spontaneously migrate to the appropriate position.

Under such state, the solder paste 11 was cured, and the electrodes 12, 13 and the antenna circuits 3, 5 were bonded by the region predominantly containing the solder component 14. At this moment, no short circuit was incurred between the antenna circuit 3 and the antenna circuit 5, and the main body of the IC chip 7 was firmly adhered to the substrate 2 by the region predominantly containing the adhesive thermosetting resin component 15.

[Performance Check of IC Tag]

The IC tag thus made up was then subjected to a performance check. Specifically, communication range measurement with a reader-writer (EFG-310-01 manufactured by Welcat Inc.), and resonant frequency measurement before and after the laminating process, with a Dip meter (DMC-230S2 manufactured by Mita Musen Kenkyusho Ltd.), were executed in addition to impedance measurement.

[Result of Performance Check]

The result of the performance check of the IC tag according to the first embodiment was as follows.

Figure 4:
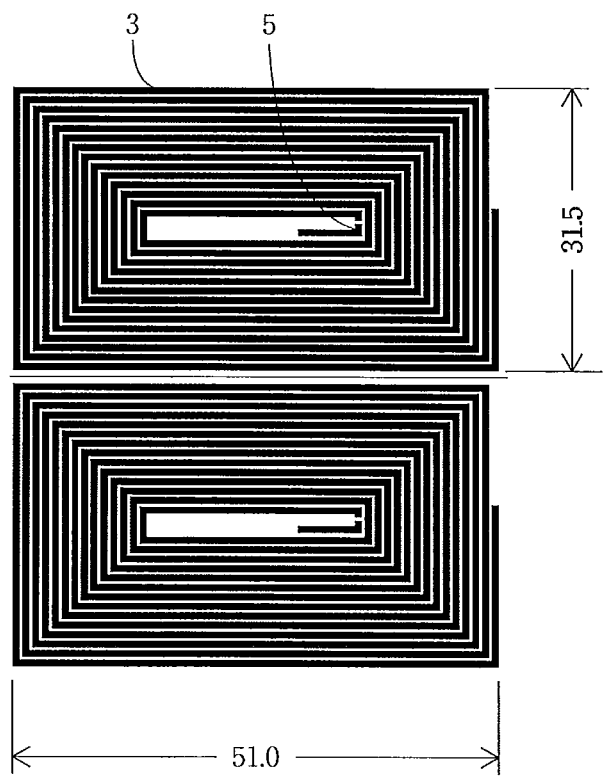
FIG. 4 is a view showing a pattern of an antenna circuit according to a second embodiment of the present invention.

(i) impedance: 13 to 15Ω
(ii) resonant frequency (before laminating): 14.20 to 14.30 MHz
resonant frequency (after laminating): 13.90 to 14.10 MHz
(iii) communication range (after laminating, aerial): 60 to 65 mm Second Embodiment Structure of IC Tag According to the same procedures as in the first embodiment, except that a glassine paper (glassine W87.5 kg) was utilized as the substrate and one on the two patterns described in FIG. 4 was utilized as the pattern of the antenna circuit, the IC tag was made, and then subjected to a performance check.

[Result of Performance Check]

The result of the performance check of the IC tag according to the second embodiment was as follows.

Figure 5:
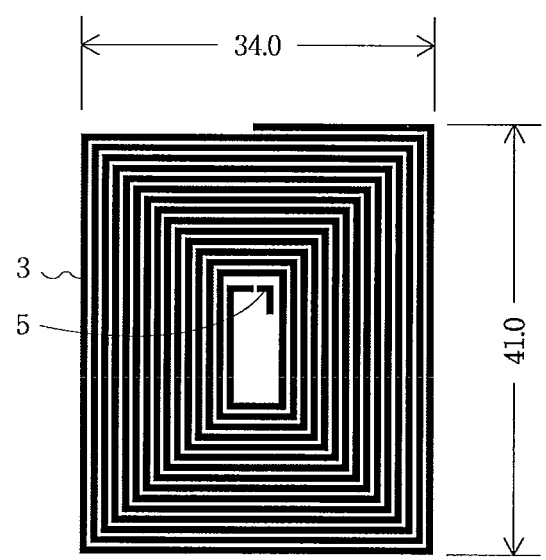
FIG. 5 is a view showing a pattern of an antenna circuit according to a third embodiment of the present invention.

(i) impedance: 12 to 17Ω
(ii) resonant frequency (before laminating): 13.80 to 13.90 MHz
resonant frequency (after laminating): 13.40 to 13.60 MHz
(iii) communication range (after laminating, aerial): 40 to 45 mm Third Embodiment According to the same procedures as in the first embodiment, except that a pattern described in FIG. 5 was utilized as the pattern of the antenna circuit, the IC tag was made, and then subjected to a performance check.

[Result of Performance Check]

The result of the performance check of the IC tag according to the third embodiment was as follows.

(i) impedance: 14 to 16Ω
(ii) resonant frequency (before laminating): 14.50 to 14.60 MHz
resonant frequency (after laminating): 14.10 to 14.30 MHz
(iii) communication range (after laminating, aerial): 35 to 40 mm In view of the performance check result, it has been confirmed that in the IC tag according to the first to third embodiments, the antenna circuit was adequately formed, the IC chip and the antenna circuit were adequately connected, sufficiently small impedance was achieved, and a good characteristic was attained in communication range. It has also been confirmed that the IC chip was firmly fixed to the substrate.

[Making up IC Tag with Sheet of Material Having a High Dielectric Constant]

Regarding the IC tag according to the first to third embodiments, however, it has been confirmed that the communication could be barely made when the IC tag was mounted on a metal body. Accordingly, upon checking the performance with a sheet of a material having a high dielectric constant (ferrite sheet of 150 μm in thickness, initial permeability 30) stuck to the rear face (opposite to the face where the antenna circuit was provided) of the IC tag, it has been confirmed that the IC tag could normally operate despite being mounted on the metal body.

Fourth Embodiment

Structure of IC Tag

Figure 6:
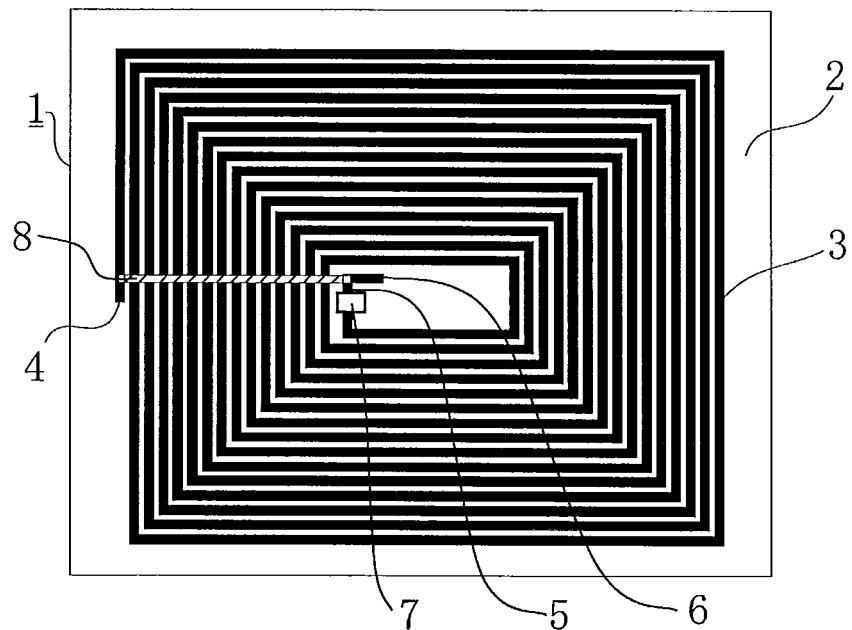
FIG. 6 is a schematic view showing an IC tag according to a fourth embodiment of the present invention.

FIG. 6 is a schematic view showing an IC tag according to this embodiment.

In FIG. 6, the reference numeral 1 designates an IC tag, and 2 a substrate (glassine paper manufactured by Lintec Corporation). Antenna circuits are denoted by 3 to 6, among which 4 and 6 designate the respective end portions of the antenna circuits. The numeral 7 designates an IC chip (I-CODE SLI manufactured by Philips Electronics N.V.), and two electrodes of the IC chip 7 (not shown) are each connected via the antenna circuit 3 and 5 respectively. The end portions 4 and 6 of the antenna circuit are connected via a jumper wire 8 (diameter 0.05 mm, coated with polyurethane in a thickness not less than 5 μm, manufactured by Riken Electric Wire Co., Ltd.).

[Formation of Antenna Circuit]

The antenna circuits 3 and 5 are formed of a Sn—Ag—Cu solder (Sn-3.5Ag-0.5Cu). The antenna circuits 3 and 5 were formed through the following process.

The glassine paper (glassine F133 kg) was fixed by the effect of static electricity, to be utilized as the substrate. On such substrate, a pattern shown in FIG. 6 was screen-printed (printing condition: ST-325 mesh, emulsion thickness 10 μm) with a solderable resin (A-5050 manufactured by Nippon Paint Co., Ltd.), and the pattern was heated at 160° C. for 30 minutes, to thereby cure the resin. The pattern was adjusted so as to be formed in a line width of 0.75 mm and a line pitch of 0.25 mm.

The pattern thus formed was coated with a Sn—Ag—Cu wire solder containing flux of 0.6 mm in diameter, with a soldering iron (temperature setting: 325° C.) After removing the solder applied to a region other than the pattern, the end portions of the jumper wire 8 were each soldered to the end portion 4 of the antenna circuit 3 and to the end portion 6 of the antenna circuit 5, respectively. Then the flux was cleaned and the substrate was dried, so that the antenna circuits 3 and 5 were obtained.

[Mounting IC Chip]

The IC chip 7 was then mounted. The procedures will be illustrated below.

A predetermined amount of solder paste containing a solder and an adhesive thermosetting resin (Sn—Bi solder paste TYCAP-5401-11 manufactured by Tamura Kasei Co. Ltd.) was applied with a dispenser, between the antenna circuits 3 and 5. Then, the IC chip 7 was tentatively placed on the substrate such that the two electrodes of the IC chip 7 were each brought into contact with the antenna circuits 3 and 5 respectively.

Heat of 160° C. was applied for 10 seconds, to thereby melt the solder component contained in the solder paste. Then the temperature was lowered to 130° C. and maintained for 30 minutes, to thereby heat-cure the adhesive thermosetting resin.

During such process, the molten solder component concentrated around the two electrodes of the IC chip 7 having high wettability with the solder component and the vicinity of the surface of the antenna circuits 3, 5 formed of the solder layer, while the adhesive thermosetting resin component was not yet cured, so that a region predominantly containing the solder component was created. Also, between the two electrodes of the IC chip 7, the region predominantly containing the adhesive thermosetting resin component 15 was created. Then, after curing the adhesive thermosetting resin, the electrodes of the IC chip 7 and the antenna circuits 3, 5 were bonded by the solder, and the IC chip 7 was adhered to the substrate 2 by the adhesive thermosetting resin.

[Performance Check of IC Tag]

The IC tag thus made up was then subjected to a performance check. Specifically, communication range measurement with a reader-writer (EFG-310-01 manufactured by Welcat Inc.), and resonant frequency measurement in aerial with a Dip meter (DMC-230S2 manufactured by Mita Musen Kenkyusho Ltd.), were executed in addition to impedance measurement.

[Result of Performance Check]

Impedance of the IC tag thus obtained, resonant frequency in aerial and communication range when the IC tag was put in aerial or on a metal base substrate (hereunder, referred to as "on metal") were measured.

The result of the performance check of the IC tag was as follows.
(i) impedance: 14 to 16Ω
(ii) resonant frequency in aerial: 14.5 MHz
(iii) communication range: in aerial: 30 mm
on metal: 0 mm As shown above, the resonant frequency in aerial is higher than the desired value of 13.56 MHz. Although good communication range was obtained in aerial, the communication range when the IC tag was mounted on metal was not good. Communication was generally difficult when IC tag was mounted on metal.

Fifth Embodiment

Making up IC Tag with Sheet of Highly Permeable Material

As stated above, the IC tag according to the fourth embodiment could not achieve a sufficient communication range on metal. Also, the communication range could not be improved despite placing a paper of the same thickness as a ferrite sheet referred to below on the metal and locating the IC tag on that paper.

Accordingly, a sheet of a highly permeable material (ferrite sheet of 150 μm in thickness, initial permeability 100) was stuck to the rear face (opposite to the face where the antenna circuit was provided) of the IC tag according to the fourth embodiment, and then the performance check was executed.

[Result of Performance Check]
The result of the performance check was as follows.
(i) resonant frequency in aerial: 12.8 MHz
(ii) communication range: in aerial: 20 mm
on metal: 10 mm It has been confirmed that the IC tag could normally operate even when placed on metal, with the simple structure that the ferrite sheet was stuck to the rear face. However, sticking the ferrite sheet resulted in degrading the aerial resonant frequency compared with the desired value of 13.56 MHz, which led to degradation in aerial communication range compared with 30 mm achieved by the fourth embodiment.

Sixth Embodiment

This embodiment represents an improvement of the fifth embodiment.

Figure 7:
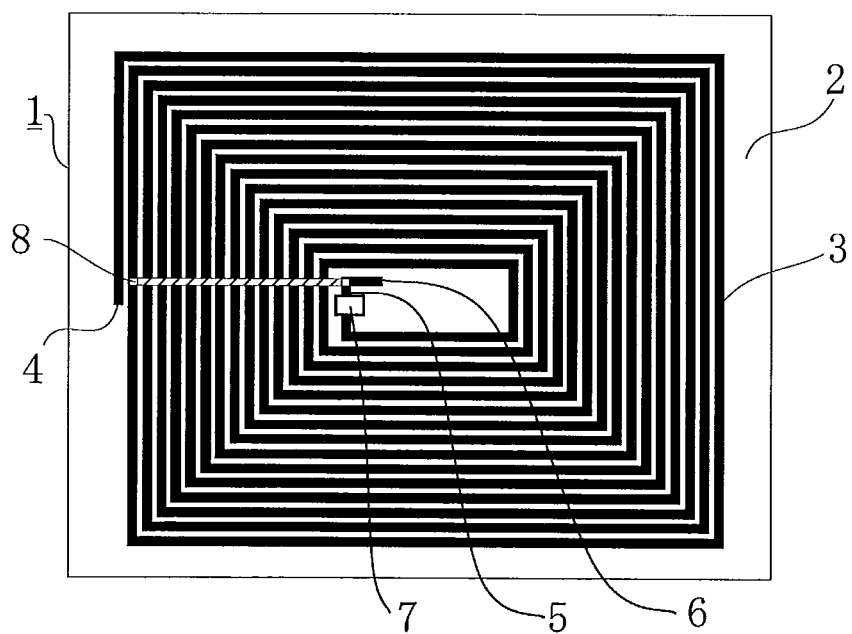
FIG. 7 is a schematic view showing the IC tag with the position of a jumper wire adjusted, according to the fourth embodiment of the present invention.
Figure 8:
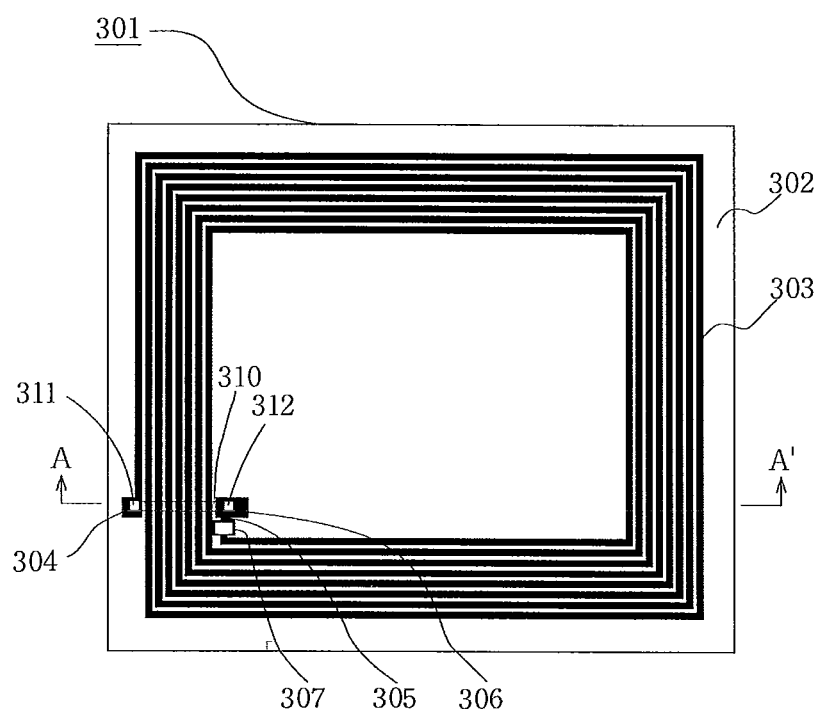
FIGS. 8(a) and 8(b) are a view and a cross-sectional view respectively, schematically showing a structure of a conventional IC tag.

[Making Up IC Tag with Modified Jumper Wire Location]
In the fifth embodiment, the jumper wire was manually soldered and press-fixed to the antenna circuit, such that the outer peripheral connection point was inwardly shifted by one turn of the outer peripheral winding as shown in FIG. 7, in order to bring the aerial resonant frequency with the ferrite sheet stuck to the IC tag closer to the desired value of 13.56 MHz. Then the ferrite sheet was stuck to the IC tag, and the performance was checked.

[Result of Performance Check]
The result of the performance check was as follows.
(i) resonant frequency in aerial
(before stucking the ferrite sheet): 15.4 MHz resonant frequency in aerial
(after stucking the ferrite sheet): 13.7 MHz
(ii) communication range: in aerial: 35 mm
on metal: 20 mm As shown in the foregoing result, the resonant frequency after the ferrite sheet was stuck could be brought closer to the desired value in the sixth embodiment. Accordingly, the aerial communication range, which degraded to 20 mm in the second embodiment could be recovered to 35 mm. Also, the communication range on metal could be improved to 20 mm, which is twice as good as that of the fifth embodiment. Thus, in this embodiment it has been confirmed that the resonant frequency could be easily adjusted to thereby improve the communication range, without modifying the antenna circuit pattern and forming the modified circuit from scratch.

Although FIG. 7 shows an example where a tip portion (outer tip portion) of the jumper wire 8 was cut off to thereby inwardly shift the connection point of the jumper wire 8 and the antenna circuit 3 by one turn of the outer peripheral winding, the same adjustment effect could also be attained by pressing a soldering iron to the jumper wire 8, instead of cutting off the tip portion of the jumper wire 8, at the position inwardly shifted by one turn of the outer peripheral winding, to thereby form a new connection point with the antenna circuit 3.

As described throughout the foregoing passages, it has been confirmed that the IC tag according to the present invention has a simple structure, and yet is capable of easily adjusting the resonant frequency at a low cost.

What is claimed is:

1. A method for manufacturing a wireless IC tag, comprising:
   forming on a surface of an electrically insulating substrate a pattern corresponding to the same pattern of an antenna circuit with a solderable resin having wettability with molten solder, wherein the solderable resin contains a metal powder selected from silver powder, copper powder, nickel powder, aluminum powder, silver-coated copper powder, silver-coated nickel powder and silver-copper alloy powder, so that the solderable resin forms the pattern of the antenna, and then
   forming the antenna circuit with molten solder on the pattern in order to exhibit excellent adhesion to the substrate.

2. A wireless IC tag which is manufactured by the method for manufacturing a wireless IC tag according to claim 1.

3. A wireless IC tag according to claim 2, wherein the IC chip is located on the same side of the substrate where the antenna circuit is provided.

4. A wireless IC tag according to claim 2, wherein the substrate is attached to a sheet made of a material having a high dielectric constant.

5. A wireless IC tag according to claim 2, wherein the substrate is constituted of a material having a high dielectric constant.

6. A wireless IC tag according to claim 3, wherein the substrate is attached to a sheet made of a material having a high dielectric constant.

7. A wireless IC tag according to claim 3, wherein the substrate is constituted of a material having a high dielectric constant.

8. The method of claim 1, wherein the solderable resin comprises a resin binder in addition to the metal powder.

9. A method for manufacturing a wireless IC tag according to claim 1, further comprising:
   placing an IC chip with electrodes on the antenna circuit together with solder paste containing solder and an adhesive thermosetting resin,
   hot-melting the solder paste at a temperature not lower than the melting point of the solder component, and
   heat-curing the adhesive thermosetting resin in the solder paste at a temperature not higher than the melting point of the solder component, so that a region predominantly containing the solder component and a region predominantly containing the adhesive thermosetting resin are created, thereby connecting each of the electrodes of the IC chip to the antenna circuit in the region predominantly containing the solder component.

10. A method for manufacturing a wireless IC tag according to claim 9, wherein the step of placing an IC chip on the antenna circuit together with solder paste containing solder and an adhesive thermosetting resin comprises a step of applying the solder paste on a connecting portion of the antenna circuit connected to the electrodes which exhibit excellent wettability with respect to the solder component of the solder paste, then placing the IC chip so that each of the electrodes connects to the connecting portion of the antenna circuit.

11. A method for manufacturing a wireless IC tag according to claim 10, wherein the adhesive thermosetting resin is a low-temperature setting resin having a curing temperature of 200° C. or lower, selected from an epoxy resin, a melamine resin, a phenol resin and a polyimide resin.

12. A method for manufacturing a wireless IC tag according to claim 1, wherein the solderable resin contains a resin binder and an unsaturated fatty acid dissolved in an organic solvent in addition to the metal powder.

13. A method for manufacturing a wireless IC tag according to claim 9, wherein the solderable resin contains a resin binder and an unsaturated fatty acid dissolved in an organic solvent in addition to the metal powder.

14. A method for manufacturing a wireless IC tag according to claim 10, wherein the solderable resin contains a resin binder and an unsaturated fatty acid dissolved in an organic solvent in addition to the metal powder.

15. A method for manufacturing a wireless IC tag according to claim 11, wherein the solderable resin contains a resin binder and an unsaturated fatty acid dissolved in an organic solvent in addition to the metal powder.

16. A method for manufacturing a wireless IC tag according to claim 12, wherein the resin binder is a low-temperature setting resin having the curing temperature of 200° C. or lower, selected from an epoxy resin, a melamine resin, a phenol resin and a polyimide resin.

17. A method for manufacturing a wireless IC tag according to claim 13, wherein the resin binder is a low-temperature setting resin having the curing temperature of 200° C. or lower, selected from an epoxy resin, a melamine resin, a phenol resin and a polyimide resin.

18. A method for manufacturing a wireless IC tag according to claim 14, wherein the resin binder is a low-temperature setting resin having the curing temperature of 200° C. or lower, selected from an epoxy resin, a melamine resin, a phenol resin and a polyimide resin.

19. A method for manufacturing a wireless IC tag according to claim 15, wherein the resin binder is a low-temperature setting resin having the curing temperature of 200° C. or lower, selected from an epoxy resin, a melamine resin, a phenol resin and a polyimide resin.

* * * * *